United States Patent [19]

Allen et al.

[11] Patent Number: 5,397,176

[45] Date of Patent: Mar. 14, 1995

[54] LOCKABLE COMPUTER TOWER UNIT HOUSING

[75] Inventors: Joseph R. Allen, Tomball; Thomas T. Hardt, Missouri City; Roberta M. Madsen, Houston, all of Tex.

[73] Assignee: Compaq Computer Corporation, Houston, Tex.

[21] Appl. No.: 269,966

[22] Filed: Jun. 30, 1994

Related U.S. Application Data

[63] Continuation of Ser. No. 955,651, Oct. 2, 1992, abandoned.

[51] Int. Cl.$^6$ ............................................. H05K 5/00
[52] U.S. Cl. ............................... 312/223.2; 312/265.6; 70/58; 70/164
[58] Field of Search ............... 312/223.2, 257.1, 263, 312/265.5, 265.6; 70/58, 63, 164, DIG. 57

[56] References Cited

U.S. PATENT DOCUMENTS

| | | | |
|---|---|---|---|
| D. 313,015 | 12/1990 | Ryan et al. | D14/102 |
| 2,658,101 | 11/1953 | Coxe | 312/257.1 |
| 3,899,721 | 8/1975 | Borchard et al. | 317/101 DH |
| 4,232,356 | 11/1980 | Saunders et al. | 361/415 |
| 4,304,966 | 12/1981 | Beirn et al. | 179/1 MN |
| 4,356,531 | 10/1982 | Marino | 312/265.5 |
| 4,532,576 | 7/1985 | Reimer | 361/415 |
| 4,748,540 | 5/1988 | Henneberg et al. | 361/424 |
| 4,761,975 | 8/1988 | Kachnowski | 70/DIG. 57 |
| 4,772,079 | 9/1988 | Douglas | 312/257.1 |
| 5,020,768 | 6/1991 | Hardt et al. | 248/678 |
| 5,021,616 | 6/1991 | Hardt | 200/43.16 |
| 5,162,976 | 11/1992 | Moore | 70/58 |
| 5,164,886 | 11/1992 | Chang | 312/257.1 |
| 5,197,789 | 3/1993 | Lin | 312/265.5 |
| 5,208,722 | 5/1993 | Ryan et al. | 360/99.01 |
| 5,216,907 | 6/1993 | Ullnann | 70/63 |
| 5,236,259 | 8/1993 | Ryan et al. | 312/244 |

OTHER PUBLICATIONS 3 photographs of bottom of IBM PX/2 Model 80 unit (cited in U.S. Pat. No. 5,020,768 listed above) (2 pgs. total).
AST Computers Advertisement in PC Week, Feb. 19, 1990, pp. 67–70 (cited in U.S. Pat. No. 5,020,768 listed above).
ALTEC Technology Corp. Advertisement in IN-FOWORLD, Feb. 5, 1990, pp. 87–88 (cited in U.S. Pat. No. 5,020,768 listed above).
Sys Technology, Inc. Advertisement in PC Week, Feb. 12, 1990, pp. 99–100 (cited in U.S. Pat. No. 5,020,768 listed above).
Advertisements in PC Week, Feb. 19, 1990 (2 pages).
System Integration Associates SIA 486/33E Review in PC Magazine, Mar. 17, 1992, pp. 265, 267.
Everex Systems Inc. Everex STEP Megacube Review in PC MAGAZINE, Mar. 17, 1992, pp. 221, 224, 226 and 227.
HP Addresses Concerns About Net–Ready PCs by Rick Vizachero in Systems & Network Integration, May 18, 1992, pp. 1, 42.
Downsized Deskpro is a Safe Bet for Network Users, PC Computing, Nov. 1990, p. 74.
Geeeint Started Manual: Compaq Deskpro 386S Personal Computer, 2nd Ed. Jan. 1989, pp. 2-3 to 2-11.
Technical Overview Manual: Compaq Deskpro 386S Personal Computer, 2nd Ed. Jan. 1989, pp. 2-1 to 2-5, 5-6.

*Primary Examiner*—Flemming Saether
*Attorney, Agent, or Firm*—Pravel, Hewitt, Kimball & Krieger

[57] ABSTRACT

A tower unit housing for a computer system including a rectangular box-like chassis which receives a front bezel, a L-shaped hood to cover the top and one side of the chassis and a side member to cover the other side of the chassis. The chassis includes a security tab which is aligned with a hood security tab and a side cover security tab when the hood and side cover are installed on the chassis such that openings in the tabs can receive a single lock to lock the entire unit together. The front bezel includes its own security tab which extends into a pin connection inside of the chassis such that the pin connection between the bezel and the chassis is hidden by the side cover when the side cover and L-shaped hood are installed on the chassis. In this manner, a single lock can secure the front bezel and, the L-shaped hood and the side cover from unauthorized disassembly.

16 Claims, 3 Drawing Sheets

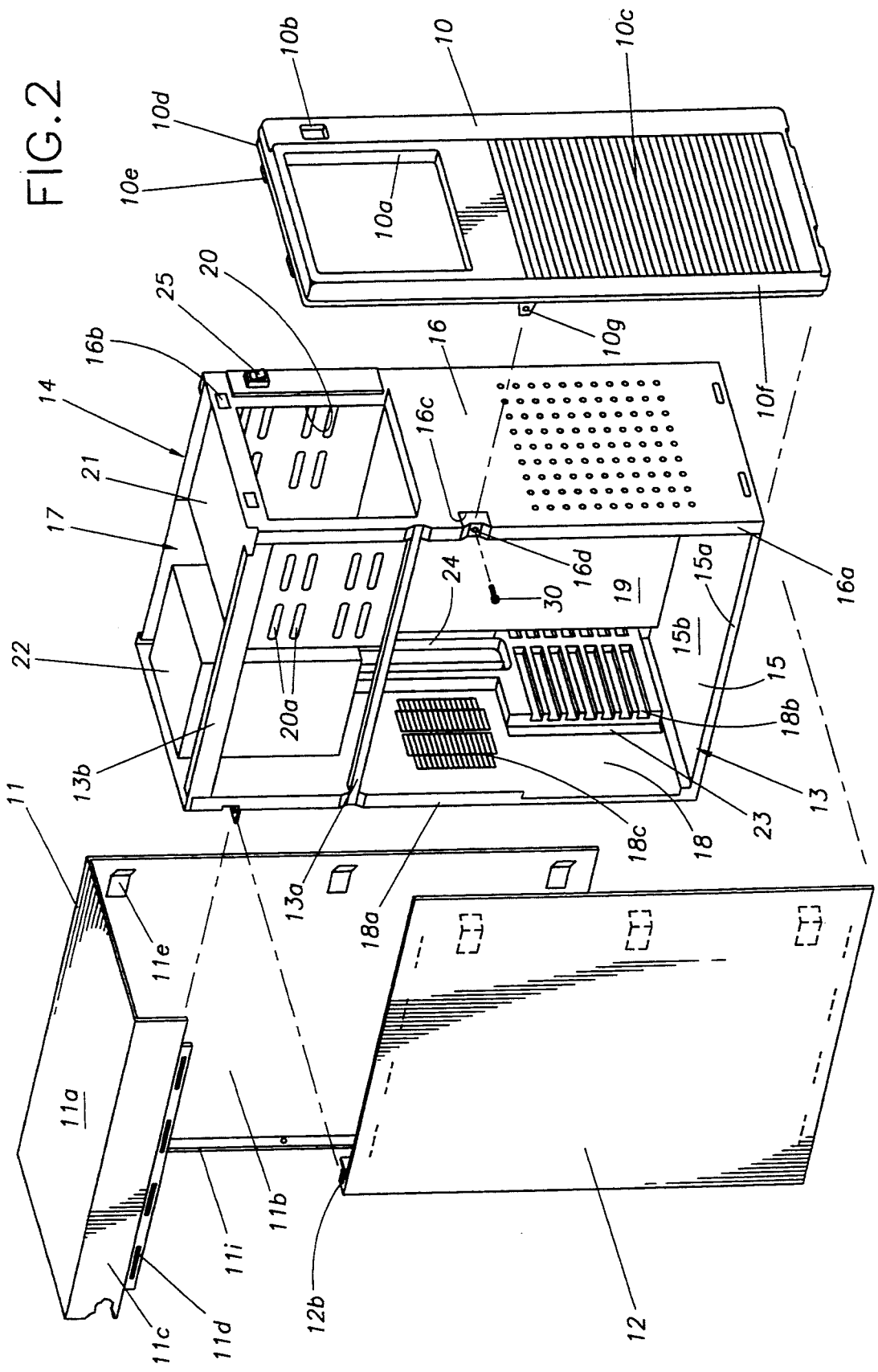

LOCKABLE COMPUTER TOWER UNIT HOUSING

This is a continuation of co-pending application Ser. No. 07/955,651, filed on Oct. 2, 1992, now abandoned.

BACKGROUND OF THE INVENTION

1. Field of the Invention

The present invention relates to a computer system tower unit housing having external side members that are lockable together onto the internal chassis by a single lock.

2. Description of the Prior Art

Personal computers are generally comprised of three physical components. Firstly, there is the main system unit which holds the computer operation internals such as power supply, circuit boards and disk drives. A keyboard is used for data entry and a display screen or monitor is provided for display of the data. This arrangement is, of course, very well known. Until recent years, all of these components have been arranged for a desk top with the keyboard placed in front of the system unit and the display screen or monitor placed on top of the system unit. Because such arrangements require considerable desk space, the computer industry developed "tower units." Tower units are generally rectangular or box-like housings adapted to sit on the floor and typically include a disk drive bay located in the upper part of the tower unit so that a user may easily access and operate the tower unit from a desk chair. In addition to the popularity of tower units for conservation of space, tower units have also become popular as file servers for networks where it is necessary for a network system to have a central file server having an assembly of more powerful computer components than found in the individual computers that form the network.

Whether a tower unit is used as a stand-alone computer or as a network file server for a network or for other purpose, it is often desirable that the tower unit housing be locked to prevent unauthorized access to the computer internals. Typically, such tower units were locked with a key lock which was mounted into the front or the rear housing panels or covers of the tower unit. Such key locks actuated one or more lock lugs which rotated into slots to hold the front or the rear panel of the computer in a locked position.

Due to the heavy competition in the computer business today, most computer companies are striving to develop an economy line of products to provide the user the fundamental computer elements at as low a price as possible. Since locks mounted into the computer housing are expensive and are not necessary for every user, it is desirable to make a tower unit which is lockable without including a built-in key lock which adds to the price of the unit but is of little value to those who do not desire to lock the unit.

SUMMARY OF THE INVENTION

It is an object of this invention to provide a tower unit housing for a computer system which is lockable by a single externally mounted lock which may be either a key lock or a combination lock. In the alternative, the user of the tower unit need not lock the unit at all and thus need not pay for a lock that the user will not use.

The tower unit housing of this invention includes a generally rectangular, boxed shape internal chassis. The internal chassis includes bottom, top, front and rear panels and first and second sides which cooperate to form a box-like internal space adapted to mount standard computer components. The rear panel of the chassis includes a rearwardly extending security tab having an opening therein. A generally L-shaped hood provides the external cover for the top and one side of the tower unit. When the hood is mounted onto the chassis by the typical friction fit, a security tab extends from the hood into a position adjacent to the chassis security tab so that the hole in the hood security tab aligns with the hole in the chassis security tab. A single side cover is positioned to cooperate with the hood to cover the other side of the chassis. This side cover also includes a security tab which, when the side cover is in position on the chassis, is positioned adjacent to the chassis security tab so that the hole in the side security tab aligns with the holes in the chassis and hood security tabs. A user may insert through these aligned security tab holes any desirable lock for securing the hood and side member in attachment to the chassis.

In order to securely mount the front bezel, the front bezel includes a tab which extends into a position of alignment with an opening in the chassis when the front bezel is mounted over the front of the chassis. A pin extends through the chassis opening and through the bezel alignment tab to hold the bezel in position. This pin as well as the bezel alignment tab are located internally of the size cover so that once the side cover is in position, the bezel retaining pin may not be accessed.

Therefore, the bezel as well as the hood and side are all secured through the chassis and may be locked against access by a single lock.

The features as just described are a generalized summary of the features of this invention. The specification will describe the details of this invention for the understanding of those skilled in the art and the claims will describe the scope of the invention coverage sought and ultimately obtained.

BRIEF DESCRIPTION OF THE DRAWINGS

FIG. 2 is a view of the tower unit housing prior to assembly of the bezel, side and hood onto the chassis;

DESCRIPTION OF THE PREFERRED EMBODIMENT

Figure 1:
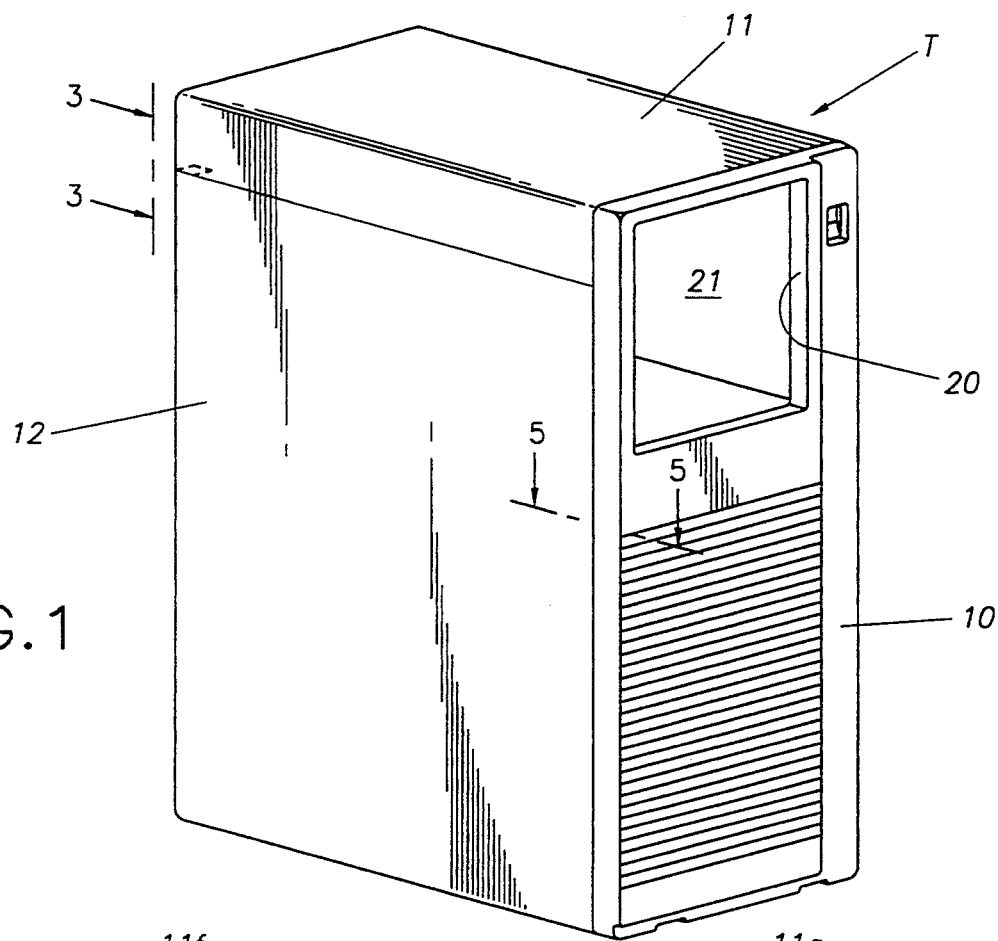
FIG. 1 is a perspective view of the tower unit housing of this invention in an assembled form.

Referring to the drawings and in particular FIG. 1, a tower unit T is illustrated. The tower unit is a generally rectangular, box-like unit adapted to sit on the floor, such as, for example, near a user or when used as a network file server, the tower unit may be centrally disposed to a network of personal computers. The tower unit T, as illustrated in FIG. 1, includes a front bezel 10, a hood 11 and a side cover 12.

The front bezel 10, hood 11 and side cover 12 are all attached to an internal chassis or frame 14 which is illustrated in FIG. 2. The chassis is aluminum but may be made of other materials. The chassis 14 is a rectangular box in configuration and includes a bottom 15, a front panel 16, an open top generally designated as 17 and a rear panel 18. The chassis 14 further includes a right side (when viewed from the front) predominantly solid panel 19. The substantially solid, typical metal side panel 19 is inter-connected to the front panel 16 and rear panel 18 by any suitable edge-to-edge connections known for computer chassis such as screws or rivets. The left-hand side, generally indicated at 13, of the chassis is basically open and is formed by left-hand edge 16a of the front panel 16, and upwardly extending bottom ledge 15a extending upwardly from the flat surface 15b of the bottom 15 and edge 18a of the rear panel 18. A cross member 13a is attached by screws or rivets to the front panel edge 16a and rear panel edge 18a. A top transverse frame member 13b extends between front panel edge 16a and rear panel edge 18a to interconnect the two panels at the top.

The front chassis panel 16 includes a generally rectangular opening 20 which serves as the disk drive bay. A disk drive mounting box 21 is attached to the front panel 16 and right chassis side 19. The box is a typically four-sided disk drive mounting box and includes a plurality of slots such as 20a which are cut into the sides of the box in a known manner to receive the disk drive units, which may be floppy disks or tape drives. The mounting box 21 may also receive one or more hard disk drives or CD or ROM drives.

A conventional power supply is mounted within the square power supply housing 22 in a known manner in order to provide power to the disk drive bay and the remainder of the computer internals in a known manner (wires for the power supply box are not shown). The rear panel 18 includes an opening 18b having an option board mounting bracket 23 attached to the inside of the panel over the opening. In this manner, various option circuit boards are horizontally mounted such that board connectors fill the slots of the option board bracket for external electrically connection in a known manner. The rear panel 18 includes a slotted area 18c which will be in general alignment with an internally mounted cooling fan for directing outside air over the system board area which will contain the operating chips which are likely to be at the hottest temperatures, which arrangement is well-known. The rear panel 18 further includes a port slot 24 which is generally elongated in a vertical direction and is provided for receiving serial ports, parallel ports, keyboard ports, mouse ports and video ports (not shown) for external electrical connection. The open area at the bottom of the internal chassis space is typically filled with the system boards in a known manner. The chassis further includes an on-off switch 25 which is connected to the power supply located in the power supply box 22 in a known manner.

Referring to FIGS. 1, 2, 5 and 6, attachment of the front bezel to the front chassis panel 16 will now be described. The front bezel 10 is a typical front bezel for a computer tower unit made of a suitable, molded plastic material to provide a pleasing exterior surface and yet be sufficiently rugged to endure wear and tear of the unit as a whole. The bezel 10 is generally rectangular in configuration and sized to align with and mount over the chassis panel 16. The front bezel 10 includes a top opening 10a of substantially the same size as the disk drive bay opening 20 in the chassis for access to the disk drives. A small opening 10b is provided in the upper right-hand corner of the bezel to be aligned with and receive the standard on-off switch 25. A series of slots 10c are formed in the lower portion of the bezel in order to allow for the passage of air through the chassis. The bezel includes a mounting rim generally designated as 10d which extends inwardly on all four sides of the bezel. The mounting rim is adapted to fit flat against the front chassis panel 16. Alignment may be enhanced by typical alignment lugs such as lugs 10e which extend into slots such as 16b on the front panel. The left mounting rim 10f of the front bezel includes a rearwardly directed tab or lug 10g which is formed with the front bezel. The tab 10g aligns with opening 16c in the front chassis panel 16 so that the alignment tab or flange extends through the opening 16c when the front bezel is mounted over the chassis front panel 16.

Figure 5:
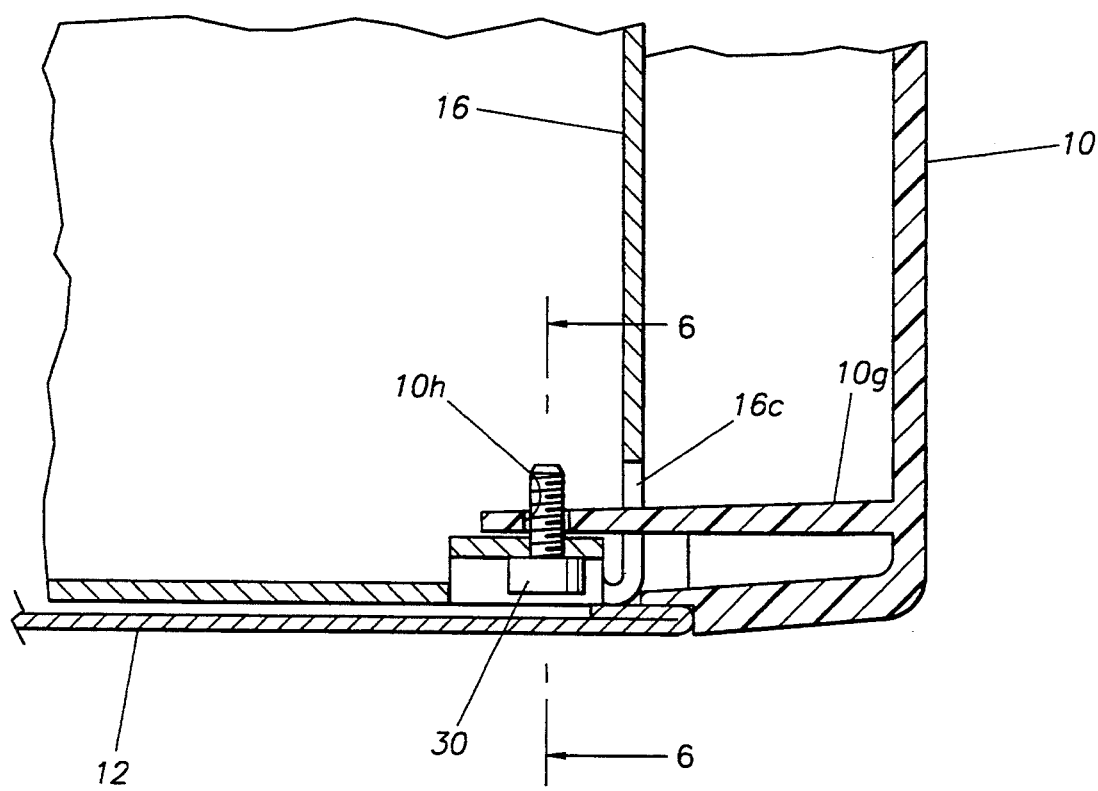
FIG. 5 is a view taken along line 5—5 of FIG. 1 illustrating the pin and tab connection of the front bezel to the chassis.
Figure 6:
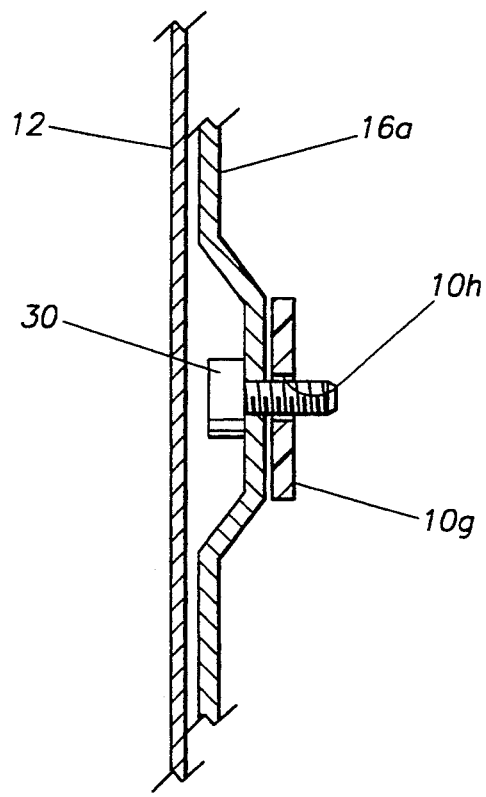
FIG. 6 is a view taken along line 6—6 of FIG. 5.

When the front bezel 10 is in its fitted position over the front chassis panel 16, an opening 10h in the bezel security tab 10g is aligned with an opening 16d in the left chassis panel edge 16a of the front panel 16. The opening 16d in the front panel edge 16a is threaded to receive threaded pin 30 and hold threaded pin 30 in a stable position. Since the opening 16d is aligned with the opening 10h in the front bezel tab 10g, as shown in FIGS. 5 and 6, the pin 30 will extend through the opening 10h in the bezel tab 10g and thus act to hold the front bezel in its mounted position. Due to the stability of the pin 30 in its threaded connection with the chassis front edge 16a, it is unnecessary to provide any type of threads in the opening 10h in the security tab 10g. In order to make a flush fit for the side cover 12, the opening 16d is located in a recess in the front chassis panel edge 16a.

The L-shaped hood 11 includes a rectangular top 11a formed integrally with right-hand cover 11b. The hood 11 further includes a downwardly depending left side portion 11c also formed integrally with the top 11a and which is adapted to extend over the top left side chassis edge 15d. The downwardly depending left side ledge 11c terminates in a series of slots 11d to be engaged by corresponding lugs shown as dotted lines on the left side cover 12. The front inside surface of the right side 11b of the hood 11 includes three spaced alignment lugs 11e which engage an edge, not shown, on the chassis in the corner formed by the right-hand chassis side panel 19 and the front chassis panel 16.

The rear portion of the hood is formed of a ledge or rim 11f which follows the rear contour of the hood 11. The ledge 11f is formed by the metal for the hood being folded back upon itself. The metal is folded inwardly from ledge 11f in flange portions 11g, 11h and 11i to provide an integrally formed recess in the rear of the hood. When the hood 11 is mounted over the chassis top 17 and right chassis side 19, the hood portion 11c fits over the chassis top inside and extends downwardly on the left-hand side frame member 15d of the chassis. A series of screws such as 35 extend through the hood rear flanges 11g, 11h and 11i to secure the hood to the chassis rear panel 18.

Figures 3, 4:
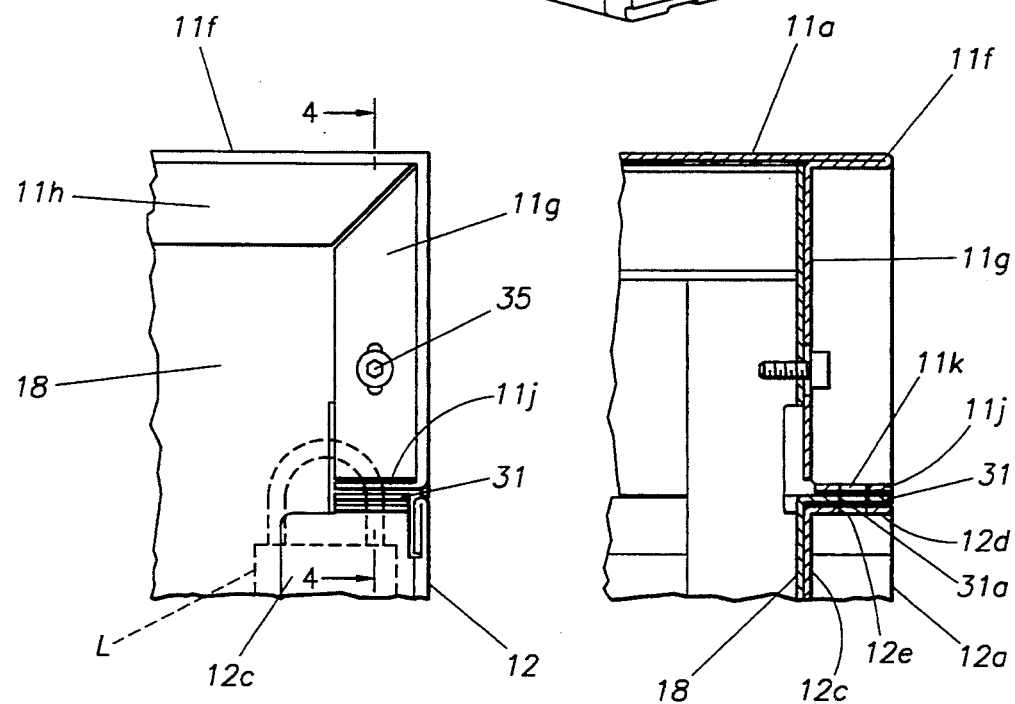
FIG. 3 is a side view taken along line 3—3 of FIG. 1 illustrating the alignment of the lockable tabs of this invention.
FIG. 4 is a view taken along line 4—4 of FIG. 3.

Referring to FIGS. 3 and 4, the internal flanged portion 11g of the hood terminates in a transversely extending security tab 11j having opening 11k. When the hood 11 is mounted over the chassis, the hood security tab 11j is positioned adjacent to the security tab 31 which is formed as part of the rear chassis panel 18. The rear chassis panel security tab 31 includes opening 31a which is aligned with the opening 11k in the hood security tab when the hood is in position. In this manner, the hood security tab is positioned adjacent to the chassis security tab and the openings 11k and 31a, respectively, are aligned to receive a lock L illustrated in dotted lines in FIG. 3.

The final cover to be described is the left side cover 12. The left side cover 12 is a generally rectangular metal sheet having formed integrally at the rear end a internal ledge 12a which is formed by folding the rear of the metal sheet 12 back upon itself and then downwardly to form an inwardly extending flange portion 12c. The inwardly extending flange portion 12c of the side member 12 is aligned with the inwardly extending flange 11g of the hood 11 when the hood and side member are installed as illustrated in FIG. 4. And, as illustrated in FIG. 4, the side member 12 further includes the tab portion 12d which extends integrally and transversely from the flanged portion 12c to provide a security tab 12d which is positioned adjacent to the chassis security tab 31 when the side member 12 is in place. The security tab 12d further includes an opening 12e which is aligned with the chassis security tab opening 31a and the hood tab opening 11k when both the hood and the side cover are installed on the chassis. In this manner, a single lock L may extend through the three openings 11k, 31a and 12e of the three security tabs to lock the entire tower unit housing.

Further, because the cover 12 when installed cover over the recessed opening 16d and the pin 30 which extends through the front bezel security tab 10g, all of the external covers are rendered inaccessible by the single lock L as shown in FIG. 3.

In order to disassemble and expose the computer internals, once the lock L is removed, the side panel 12 may be first removed and thereafter the hood 11 and front bezel 10 are removed to expose the entire chassis for repair if necessary.

Having described the invention above, various modifications of the techniques, procedures, material and equipment will be apparent to those in the art. It is intended that all such variations within the scope and spirit of the appended claims be embraced thereby.

We claim:

1. A tower unit housing for a computer system, which housing may be secured from unauthorized access by a single lock, comprising:
a generally rectangular, box-shaped chassis including bottom, front and rear panels, first and second sides and a top forming a box-like interior adapted to mount standard computer components therein;
said rear chassis panel having a security tab extending therefrom, said rear panel security tab having an opening; and
a U-shaped assembly having an open front and rear and an open bottom, said assembly including a hood and a side cover and being fastened to said chassis independent of the single lock, wherein:
said hood includes a top hood face and a side face, said hood mounting over said chassis top and first side, said hood including a security tab extending to a position adjacent to said chassis rear panel security tab with said hood mounted onto said chassis, said hood security tab having an opening which aligns with said opening in said rear panel security tab; and
said side cover positioned to mount over said second chassis side, said side cover having a security tab extending to a position adjacent to one of said hood and chassis security tabs, said side cover security tab having an opening which aligns with said openings in said hood and chassis security tabs so that the lock may be inserted through said aligned tab openings to secure said hood and side panels to said chassis and prevent unauthorized access to the interior of said tower unit.

2. The tower unit of claim 1, further including:
a front bezel mounting over said chassis front panel, said front bezel including a bezel tab having an opening therein;
said chassis having an opening which aligns with said opening in said bezel tab with said bezel mounted onto said front chassis panel; and
a pin inserted through said openings in said chassis and in said bezel tab for retaining said bezel with said chassis.

3. The tower unit of claim 2, including:
said pin, said bezel tab and said opening in said chassis being covered by said side cover mounted onto said chassis to prevent unauthorized access to said tower unit through removal of said bezel such that said single lock acts to secure said bezel, said side cover and said L-shaped hood to said chassis.

4. The tower unit of claim 2, including:
said bezel tab being positioned internally of said chassis opening;
said chassis opening being threaded; and
said pin being threaded to threadedly engage and extend through said bezel tab without threaded connection to said bezel tab.

5. The tower unit of claim 1, including:
said chassis tab extending rearwardly from said rear chassis surface and said hood security tab and said side cover security tab extending toward said chassis security tab to align with said chassis security tab, said side cover and hood security tabs being positioned adjacent to said chassis tab.

6. A tower unit housing for a computer system, comprising:
a chassis including bottom, front and rear panels, first and second sides and a top forming an interior adapted to mount standard computer components therein;
said rear chassis panel having a security tab extending therefrom, said rear panel security tab having an opening therein; and
a U-shaped assembly having an open front and rear and an open bottom, said assembly including a generally L-shaped hood and a side cover fastened to said chassis, wherein:
said hood includes a top hood face and a side face, said hood positioned over said chassis top and first side, said hood including a security tab having an opening which aligns with said chassis rear panel security tab opening when said hood is positioned onto said chassis; and
said side cover positioned over said second chassis side, whereby a lock may be inserted through said aligned tab openings to secure said hood to said chassis.

7. The tower unit of claim 6, further including:
a front bezel mounting over said chassis front panel, said front bezel including a bezel tab having an opening therein;
said chassis having an opening which aligns with said opening in said bezel tab with said bezel mounted onto said front chassis panel; and a pin inserted through said openings in said chassis and in said bezel tab for retaining said bezel with said chassis.

8. The tower unit of claim 7, including:
said pin, said bezel tab and said opening in said chassis being covered by said side cover mounted onto said chassis.

9. The tower unit of claim 7, including:
said bezel tab being positioned internally of said chassis opening;
said chassis opening being threaded; and
said pin being threaded to threadedly engage said chassis without threaded connection to said bezel tab.

10. The tower unit of claim 6, including:
said chassis tab extending rearwardly from said rear chassis surface and said hood security tab extending toward said chassis security tab to align with said chassis security tab.

11. A tower unit housing for a computer system, comprising:
a chassis including bottom, front and rear panels, first and second sides and a top forming an interior adapted to receive standard computer components therein;
said rear chassis panel having a security tab extending therefrom, said rear panel security tab having an opening therein;
a U-shaped assembly having an open front and rear and an open bottom, said assembly having a hood and a side cover fastened to said chassis, wherein:
said hood includes a top hood face and a first side face, said hood positioned with said chassis top and first sides; and
said side cover positioned with said second chassis side, said side cover having a security tab extending to a position adjacent to said chassis security tab, said side cover security tab having an opening which aligns with said chassis security tab opening so that a lock may be inserted through said aligned tab openings to secure said side panel to said chassis.

12. The tower unit of claim 11, including:
a front bezel mounting over said chassis front panel, said front bezel including a bezel tab having an opening therein;
said chassis including an opening which aligns with said opening in said bezel tab with said bezel mounted onto said front chassis panel; and
a pin inserted through said openings in said chassis and in said bezel tab for retaining said bezel with said chassis.

13. The tower unit of claim 12, including:
said pin, said bezel tab and said opening in said chassis being covered by said side cover mounted onto said chassis to prevent unauthorized access to said tower unit through removal of said bezel such that said single lock acts to secure said bezel and said side cover to said chassis.

14. The tower unit of claim 12, including:
said bezel tab being positioned internally of said chassis opening;
said chassis opening being threaded; and
said pin being threaded to threadedly engage said chassis without threaded connection to said bezel tab.

15. The tower unit of claim 11, including:
said chassis tab extending rearwardly from said rear chassis surface and said side cover security tab extending toward said chassis security tab to align with said chassis security tab.

16. The tower unit of claim 11, including:
said hood being J-shaped and having a second side, said second side positioned with said chassis second side.

* * * * *